United States Patent
Kawamura et al.

(10) Patent No.: US 6,811,878 B2
(45) Date of Patent: Nov. 2, 2004

(54) CONDUCTIVE FILM

(75) Inventors: Koichi Kawamura, Shizuoka-ken (JP);
Miki Takahashi, Shizuoka-ken (JP);
Morio Yagihara, Shizuoka-ken (JP);
Takao Nakayama, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 195 days.

(21) Appl. No.: 10/179,210

(22) Filed: Jun. 26, 2002

(65) Prior Publication Data

US 2003/0008135 A1 Jan. 9, 2003

(30) Foreign Application Priority Data

Jun. 27, 2001 (JP) ........................................ 2001-195449
Aug. 30, 2001 (JP) ........................................ 2001-261052
Oct. 23, 2001 (JP) ........................................ 2001-325089

(51) Int. Cl.$^7$ ............................................... B32B 5/16
(52) U.S. Cl. .................. 428/402; 428/403; 428/407; 428/457; 428/458; 428/461
(58) Field of Search ................................. 428/402, 403, 428/407, 457, 458, 461

(56) References Cited

FOREIGN PATENT DOCUMENTS

EP 1336637 A1 * 8/2003

* cited by examiner

*Primary Examiner*—Leszek B. Kiliman
(74) *Attorney, Agent, or Firm*—Burns, Doane, Swecker & Mathis, L.L.P.

(57) ABSTRACT

The present invention relates to a conductive film excellent in electrical conductivity and durability and useful for display elements and solar cells. In particular, the invention relates to a conductive film comprising conductive fine particles adsorbed to a support, a conductive film comprising a transparent conductive layer such as an ITO layer provided on a support, and a conductive film comprising a conductive polymer layer, instead of the ITO layer, formed on a support.

20 Claims, No Drawings

CONDUCTIVE FILM

BACKGROUND OF THE INVENTION

1. Field of the Invention

The present invention relates to a transparent conductive film that is excellent in electrical conductivity and durability and useful for display elements and solar cells. In particular, the invention relates to a conductive film comprising conductive fine particles adsorbed on a support, a conductive film comprising a transparent conductive layer such as an ITO layer provided on a support, and a conductive film comprising a conductive polymer film, instead of the ITO layer, provided on a support.

2. Description of the Related Art

Image displays such as a liquid crystal display (LCD), plasma display (PDP) and electro-luminescence (EL) element have been widely used in many applications such as televisions, computers and various mobile devices that have spread in recent years, and development thereof is making remarkable progress. At the same time, general use of solar cells achieving higher performance is increasingly demanded with the trend to avoid using energy from fossil fuels for the sake of the global environment.

Conductive films are used for such display elements and solar cells. Among conductive films, a transparent conductive film is preferably a conductive film that exhibits high electrical conductivity and high transmittance in a visible light region, specifically transmittance of above 80% in a wavelength region of 380 to 780 nm.

Although metals such as Au, Ag, Cu or Al have been used for producing the conductive film by forming the metals into a foil with a thickness of about 3 to 15 nm, the metal foil has drawbacks including large absorption and insufficient strength. In recent years, as a transparent conductive film, a so-called ITO film having low electrical resistance has been produced by depositing on a glass support indium oxide ($In_2O_3$) containing tin as a dopant, and has been widely used as an electrode for display elements such as liquid crystal displays. Display elements used for cellular phones and mobiles are becoming lighter by an order of grams, and supports for the display elements are currently shifting from glass to plastic. By using a plastic support, the weight of the display element has been reduced to one half of the weight of conventional display elements, while strength and impact resistance have simultaneously been remarkably improved. However, there has been a problem with ITO conductive films in that the conductive film is likely to be peeled off from the support since the material for the support has been changed from grass to a plastic film. The problem is caused by the fact that a plastic film has a hydrophobic surface and, hence, a lower adhesiveness with respect to a conductive material, such as a metal-based material, as compared with a glass support having on a surface thereof polar groups, such as hydroxyl groups, and hence a high adhesiveness with respect to a conductive material due to undergoing a reaction with the material.

From the standpoint of heat resistance, although the crystallizing temperature of an ITO film is around 150° C., a polycarbonate support, which is a highly transparent resin suitable for the support, cannot be heated above 100° C. due to its thermal properties. As a result, the obtained ITO film is an amorphous film exhibiting low mechanical strength and high electrical resistivity as compared with a crystalline ITO film. Thus, the produced ITO film is inconvenient for application where a low electrical resistivity is required. In addition, production of ITO films is very costly since the base material, indium, is a highly expensive and rare metal, thus imposing a limit on the amount by which the production cost of the support can be reduced.

In light of this, use of a transparent conductive film mainly comprising a zinc oxide (ZnO) layer has been gradually spreading due to its low cost and stable distribution. If Al and other impurities are added to a ZnO layer, the layer acquires a low electrical resistance comparable to that of the ITO film. Further, as another alternative to the ITO-based conductive film, use of a conductive polymer is known in the art to produce a conductive film. If a conductive polymer is used, a thin film capable of exhibiting conductivity can be produced by a coating method, thus providing an advantage in that the film can be manufactured at low cost. Also, since an electrode produced from a conductive polymer exhibits far more flexibility than an electrode made from an ITO film does, and since it is low in fragility and unlikely to be broken even when the electrode is used for products that require flexibility, the conductive polymer has an advantage of providing products with a prolonged service life, especially when a product such as a touch screen, which requires a highly flexible electrode, is manufactured. European Patent Application No. 440957 discloses a technique for producing such a conductive film by using polythiophene containing a polyanion. However, these conventionally known conductive films have been found to exhibit relatively low scratch resistance, as compared with the ITO film, and to exhibit an insufficient level of strength for practical use in certain kinds of applications. Further, conventional conductive films do not have sufficient adhesiveness with respect to a support, currently failing in displaying their advantageous characteristics of flexibility.

Conductive films, such as an ITO-based transparent conductive film obtained by using metallic materials, are usually manufactured by forming a metallic material layer on a glass support through a vapor phase method, such as vacuum deposition or sputtering. A ZnO-based transparent conductive film is usually manufactured through methods such as sputtering or CVD. However, the sputtering method has a problem in that manufacturing costs are high because the apparatus used therein is expensive, and this method is not suitable for manufacturing a large area film. In the case of the CVD methods, although the manufacturing costs are low because the apparatus used is inexpensive and continuous production is possible, there is a problem in that a formed film having a smooth surface has enhanced resistivity to thereby produce lowered electrical conductivity.

Regarding of which method is adopted from among vacuum deposition, sputtering or CVD, the produced metallic thin film has drawbacks including insufficient strength and low adhesiveness with respect to the support, as well as low abrasion resistance and low durability. In view of improving film strength, a method has been proposed in which conductive metallic fine particles are fixed on the support using a binder for producing a conductive film. This method, however, may possibly reduce electrical conductivity depending on the conditions for fixing the fine particles, because the binder itself has no electrical conductivity. In view of the foregoing, there has been a demand for a conductive film which fulfils requirements of both sufficient strength and high conductivity (i.e., low resistivity).

SUMMARY OF THE INVENTION

Considering the drawbacks of the prior art described above, it is an object of the present invention to provide a transparent conductive film which has excellent conductivity and durability and is suitably used for image display elements and solar cells. Another object of the invention is to provide a conductive film which can be manufactured in low cost, has high strength, good adhesiveness to the support even when adhered to a resin support, and high scratch resistance.

The inventors conducted intensive research, in particular investigating high ion-adsorbing property of a graft polymer which is formed on the surface of a support, and found that the graft polymer has a strong ability to adsorb charged particles and allows arrangement and dense line-up of conductive particles. The inventors also found that a conductive film having excellent conductivity and durability can be produced by forming a hydrophilic surface by making hydrophilic polymer chains present on the surface, and further by properly combining such a hydrophilic surface and a conductive polymer, and finally accomplished the present invention.

According to a first aspect of the present invention, there is provided a conductive film comprising a support having introduced to at least one surface thereof ionic groups to which conductive fine particles, having electrical charges so as to be bindable to the ionic groups, are electrostatically bonded.

In the first aspect of the invention, it is preferable that a transparent support having introduced ionic groups to a surface thereof for adsorbing conductive fine particles comprises a surface graft polymer introduced thereto by graft polymerization.

According to a second aspect of the present invention, there is provided a conductive film comprising a support, which includes hydrophilic graft polymer chains, and a layer of a conductive material provided on the support.

In the second aspect of the invention, it is preferable that the conductive material for forming the conductive material layer is a metal or an oxide semiconductor, and the layer of the conductive material is formed by a vapor phase method.

According to a third aspect of the present invention, there is provided a conductive film comprising a support, which includes hydrophilic polymer chains, and a layer of a conductive polymer provided on the support.

In the third aspect of the invention, it is preferable that the hydrophilic polymer contains hydrophilic graft polymer chains.

Although the functional mechanism of the present invention is not elucidated, the following is conjectured. If ionic groups are introduced into the surface of a support, the support surface produces a layer which is densely and uniformly lined-up with conductive fine particles having a charge opposed to that of the ionic group. That is, a surface layer densely lined-up with conductive fine particles can be formed without using any binder, and the thus formed layer exhibit excellent conductivity even if the layer is thin. Since ionic groups on the surface of the support tightly adsorb the conductive fine particles via an electrostatic attraction force due to mutually opposite charges, it may be conjectured that abrasion resistance of the surface would increase to thus produce high durability. The present invention has an advantage that a transparent conductive film can readily be formed by selecting transparent materials for the support and specifying the diameter of conductive fine particles to be adsorbed.

In the present invention, the support has a hydrophilic surface since hydrophilic graft polymer chains are present on the support surface. And since the hydrophilic graft polymer chains contain polar groups, when a conductive material or a conductive polymer is closely arranged to the surface of a support, the hydrophilic polymer chains function to tightly adsorb the conductive material or the conductive polymer via a polar interaction to thereby form a layer which is densely and uniformly lined-up with conductive particles. As a result, it is conjectured that abrasion resistance and scratch resistance are increased even when the layer is thin, thereby achieving high durability. The conductive film of the present invention provides advantages that since a pure conductive layer can be formed without providing any intermediate layer such as a binder layer, the formed layer exhibits high conductivity and transparency due to thinness.

It is also conjectured that when the hydrophilic graft polymer to be used in the invention is a polycarboxylic acid, i.e., a polymer having carboxylic groups (e.g., polyacrylic acid or polymethacrylic acid) or a polysulfonic acid, i.e., a polymer having sulfonic groups (e.g., polystyrene sulfonic acid or polyvinyl sulfonic acid), the hydrophilic graft polymer acts as a polyanion or a dopant of the conductive polymer and creates a strong ionic interaction with the conductive polymer, thereby providing the film with particularly high strength and high conductivity.

The structure of such a surface phase having fine particles and the structure of such a conductive material layer having high strength can be confirmed by observing the surface by means of a transmission electron microscope or an AFM (atomic force microscope).

DESCRIPTION OF THE PREFERRED EMBODIMENTS

The description of the present invention is given in detail hereinafter.

First Aspect

The conductive film according to the first aspect of the present invention comprises a support having ionic groups on at least one surface thereof. The surface having ionic groups is preferably formed by surface graft method. In order to obtain a transparent conductive film, a transparent support is preferably used.

The surface formed by surface graft method refers to that an ionic monomer is grafted on the surface of a polymer constituting the support by a conventional method using light, an electron beam or heat such that the thus grafted ionic monomers forms ionic groups on the surface of the support. The ionic monomer to form the ionic groups include monomers having positive charges such as ammonium and phosphonium, or monomers having acidic groups having negative charges or capable of dissociating into negative charges, such as sulfonic acid groups, carboxylic groups, phosphoric acid groups and phosphonic acid groups.

Conventional methods known in the art may be used for forming a surface having the graft polymer having the ionic groups on the film support. An example of the methods is described in a literature entitled "Surface Modification and Adhesion Using Macromonomer" by Shinji Sugii, the *Journal of Association of Rubber of Japan*, vol. 65, 604, 1992. In addition, a method called surface graft polymerization described below may also be applied.

In the method called surface graft polymerization, active species are attached to a polymer chain to initiate polymerization of another monomer, to thereby produce a graft polymer. When a polymer compound having reactive groups serving as active species forms a solid surface, this method is called surface graft polymerization.

Any methods known in the art described in following literatures may be used for carrying out surface graft polymerization so as to implement the present invention. For example, "New Experimental Polymer Science" vol. 10, p. 135 (ed. by Association of Polymer Science of Japan, 1994, Kyoritsu Publishing Co.) describes photo-graft polymerization and plasma irradiation graft polymerization as an example of surface graft polymerization. "Handbook of Adsorption Technology" (NTS Co., ed. by Takeuchi, February 1999, p.203 and p.695) describes radiation graft polymerization using γ-ray, an electron beam and the like.

Examples of the photo-graft polymerization method include the methods disclosed in Japanese Patent Application Laid-open (JP-A) Nos. 63-92658, 10-296895 and 11-119413.

Additional examples of methods for forming a surface having a surface graft polymer include a method in which a reactive functional group such as a trialkoxysilyl group, isocyanate group, amino group, hydroxyl group and carboxyl group is attached to the terminal of a polymer compound chain to cause a coupling reaction with a functional group on the surface of the support.

The literatures listed above and the method described in Macromolecules by Y. Ikeda et al. vol. 19, p.1804, 1986 may also be used for plasma graft polymerization and radiation graft polymerization. More specifically, a surface of a polymer such as PET is treated with plasma or an electron beam to generate radicals on the surface to cause a reaction between an activated surface with a monomer having an ionic functional group, to thereby produce a surface having a graft polymer or a surface layer having ionic groups.

In addition to the methods described in the literatures listed above, photo-graft polymerization may be carried out as disclosed in JP-A Nos. 53-17407 (Kansai Paint Co., Ltd.) and 2000-212313 (Dainippon Ink and Chemicals, Incorporated), in which a photo-polymerizable composition is applied by coating on the surface of a film support, then brought to contact with an ionic radically polymerizable product followed by light irradiation.

Examples of the ionic monomers capable of forming ionic groups for suitably use in the present invention include a monomer having positive charges such as ammonium and phosphonium, and a monomer having acidic groups having negative charges or capable of dissociating into negative charges such as sulfonic acid groups, carboxylic groups, phosphoric acid groups and phosphonic acid groups.

Specific examples of the ionic monomer particularly useful in the present invention include monomers such as (meth)acrylic acid or the alkali metal salts and the amine salts thereof; itaconic acid or the alkali metal salts and the amine salts thereof; allylamine or the halogenated hydroacid salts thereof; 3-vinylpropionic acid or the alkali metal salts or the amine salts thereof; vinylsulfonic acid or the alkali metal salts and the amine salts thereof; vinylstyrene sulfonic acid or the alkali metal salts and the amine salts thereof; 2-sulfoethylene(meth)acrylate, 3-sulfopropylene(meth) acrylate or the alkali metal salts and the amine salts thereof; 2-acrylamide-2-methylpropane sulfonic acid or the alkali metal salts and the amine salts thereof; phosphoric acid monomers such as mono(2-acryloyloxyethyl)acid phosphate, mono(2-methacryloyloxyethyl)acid phosphate, acid phosphooxy polyethyleneglycol mono(meth)acrylate or the alkali metal salts and the amine salts thereof.

In order to produce a transparent conductive film by using the conductive film obtained in the present invention to be used for image display elements and solar cells, it is preferable to use a transparent support having a smooth surface. And in order to further improve electric conductivity, the support may previously be surface-roughened to increase the surface area for introducing a larger amount of ionic groups.

The support may be surface-roughened by selectively using known methods adaptable to the material of the support surface. In more detail, if the support is a resin film, suitable examples of the method include glow discharge, sputtering, sand blasting, buffing, particle adhesion and particle coating. When the support is a metal plate such as an aluminum plate, methods such as a method for mechanically roughening the surface, a method for electrochemically dissolving and roughening the surface, and a method for chemically dissolving the surface selectively, and additionally, mechanical methods known in the art such as ball polishing, brush polishing, blast polishing and buff polishing may be used. Further, the surface may electrochemically be roughened by using a combination of an alternating current and a direct current in an electrolytic solution of hydrochloric acid or nitric acid. A combination of a mechanical method and an electrochemical method may also be used.

Conductive fine particles having electrical charges capable of ionically binding to the ionic groups are described hereinafter.

The fine particles for use in the present invention are not particularly limited so long as the particles have electrical conductivity, and any fine particles containing a known conductive material may be used through selection. Preferable examples of the fine particles include fine particles of a metal such as Au, Ag, Pt, Cu, Rh, Pd, Al and Cr; fine particles of an oxide semiconductor such as $In_2O_3$, $SnO_2$, ZnO, CdO, $TiO_2$, $CdIn_2O_4$, $Cd_2SnO_2$, $Zn_2SnO_4$ and $In_2O_3$—ZnO; fine particles of these materials doped with impurities compatible thereto; fine particles of spinel structure compounds such as MgInO and CaGaO; fine particles of a conductive nitride such as TiN, ZrN and HfN; fine particles of a conductive boride compound such as LaB; and fine particles of a conductive polymer as an organic material.

The diameter of the conductive fine particle is preferably in the range of 0.1 nm to 1000 nm, more preferably in the range of 1 nm to 100 nm. When the diameter is smaller than 0.1 nm, electrical conductivity arising from continuous contact between the surfaces of fine particles with each other tends to be decreased. When the diameter is larger than 1000 nm, adhesiveness between the graft surface and the particles tends to be decreased due to a decreased surface area for ionically binding to the graft surface, thereby impairing film strength.

In order to produce a transparent conductive film, especially for the purpose of securing light transmittance, the diameter of the particles used is preferably in the range of 0.2 to 100 nm, more preferably 1 to 10 nm.

In the present invention, the particles which ionically bind to the graft surface are disposed in a regularly aligned manner to form a monolayer.

The fine particles having high positive charges to be densely disposed on the surface can be manufactured by the method of Toru Yonezawa et al, or by the method described in Chemistry Letters, 1999, p.1061; Langumuir 2000, vol. 16, 5218; and Polymer Preprints, Japan, vol. 49, 2911, 2000 written by Toru Yonezawa et al. Yonezawa et al. discloses that the surface made of metal particles can chemically be modified by functional groups densely having positive charges by utilizing a metal-sulfur bond.

It is preferable, in view of durability, that these fine particles are bound to the ionic groups in an amount as large as possible by being adsorbed to the ionic groups on the surface of the support. From the standpoint of securing electrical conductivity, a dispersion preferably has a dispersal concentration of the fine particles of about 10 to 20% by weight.

Examples of the method for binding conductive fine particles to ionic groups on the surface of the support include a method of coating a dispersion of the fine particles bearing positive charges onto the surface of the support having ionic groups; and immersing a film support having ionic groups on the surface thereof into a dispersion of the fine particles bearing electrical charges on the surface of the particle. Which method is adopted, coating or immersing, the contact time between the dispersion and the support bearing ionic groups on the surface thereof is preferably about 10 seconds to 180 minutes, more preferably 1 minute to 100 minutes, in order to supply an excessive amount of conductive fine particles and to effect sufficient ionic bonding between the fine particles and ionic groups.

Support

A support for use in the present invention may have a layer on the surface thereof to form a graft thereon.

As the support for forming the conductive film of the present invention, any plate materials that are dimensionally stable and fulfil the requirements of flexibility, strength and durability may be used. When a transparent support is used in view of light transmittance, preferable examples of the transparent substrate include glass and plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyacetal). Other examples of the support for producing the conductive film that does not require transparency include a sheet of paper, a sheet of paper laminated with a plastic, a metal plate (e.g., aluminum, zinc and copper plate), a sheet of paper or a plastic film laminated or disposed with a metal.

Among the above listed supports, a support having a surface made of a polymer resin is preferable. Specific examples of the support include a resin film, a transparent inorganic support such as glass coated with a resin on the surface thereof, and a composite material containing a resin layer on the surface thereof.

Examples of the support coated with a resin on the surface thereof include a laminated plate in which a resin film is adhered to the surface thereof, a support treated with a primer, and a support treated with a hard coat. Examples of the composite material containing a resin layer on the surface thereof include a material sealed with a resin and provided with an adhesive layer on the back face, and a sandwich glass produced by laminating glass and a resin.

The conductive film of the present invention comprises a support having introduced on the surface thereof ionic groups and has a layer in which the ionic groups electrostatically adsorb conductive fine particles arranged densely and uniformly to form a monolayer. The conductive film can be formed without using a binder and has a surface layer in which ionic groups adsorb conductive fine particle. Thus the conductive film is a thin film and capable of exhibiting excellent electrical conductivity originating from the material of the conductive fine particles used. Since this conductive film is thin and excellent in light transmittance, if a transparent material is used for the support, a transparent conductive film can readily be obtained and suitably be used for transmissive image display elements and solar cells.

This conductive film can be formed by a relatively simple processing on the surface of the support. In addition, since the surface layer which exhibits excellent conductivity is highly durable, the conductive film may appropriately be used for various objects as described above.

Second Aspect

The conductive film according to the second aspect of the present invention comprises a support including hydrophilic graft polymer chains on at least one surface thereof, and comprises a layer of a conductive material provided on the support.

First, a support having a hydrophilic surface having hydrophilic graft polymer chains is described hereinafter.

The hydrophilic surface according to the present invention refers to a surface of a support on which the hydrophilic graft polymer chains are present. The hydrophilic surface may be a surface on which hydrophilic graft polymer chains are directly bound to the surface of the support, or a surface provided with a layer to form a hydrophilic polymer grafted thereon by providing the layer to which the hydrophilic polymer is likely to bind.

Further, a hydrophilic surface usable in the present invention may be provided by employing coating or cross-linking such that a hydrophilic polymer is arranged by using a polymer in which hydrophilic graft polymer chains are bound to a backbone polymer or hydrophilic graft polymer chains are bound to a backbone polymer and further to which the cross-linking functional groups are introduced, or by using a composition containing hydrophilic polymer chains having a cross-linking group at the polymer terminal and a cross-linking agent.

The hydrophilic polymer used in the present invention is characterized in that the terminal of the polymer is bound to the surface or surface layer of the support, and graft portions exhibiting hydrophilicity are substantially not cross-linked. Mobility of the polymer portion that exhibits hydrophilicity is not restricted or the portion is not embedded in the rigid cross-linked structure, whereby the polymer can maintain high mobility. Therefore, it is understood that the hydrophilic polymer can exhibit excellent hydrophilicity as compared with conventional hydrophilic polymers having a usual cross-linked structure.

The molecular weight (Mw) of the hydrophilic graft polymer chain is in the range of 500 to 5,000,000, preferably in the range of 1,000 to 1,000,000, and more preferably in the range of 2,000 to 500,000.

As used herein, "(a) surface graft" refers to a surface on which hydrophilic graft polymer chains are directly bound to the surface of the support or bound to the layer provided on the surface of the support; and "(b) cross-linked hydrophilic layer to which hydrophilic graft polymer chains are introduced" refers to a layer in which the hydrophilic graft polymer chains are introduced and then cross-linked to form a layer.

Method for Forming (a) Surface Graft

A surface having hydrophilic groups of the graft polymer may be formed on the support mainly by two methods: one is a method in which the graft polymer is attached to the support via chemical bonding; and the other is a method in which a compound having a polymerizable double bond is allowed to polymerize at the active sites to form a graft polymer.

First, a method of attaching a graft polymer to the support via chemical bonding is described.

In this method, a polymer having at the terminal or the side chain thereof a functional group, which is reactive to the support of the polymer, is used to cause a chemical reaction between this functional group and the functional group on the surface of the support to allow the polymer grafted on the support. The functional group which is reactive to the support is not particularly limited so long as it is reactive to the functional group on the surface of the support. Examples of the functional group include a silane coupling group such as alkoxysilane, an isocyanate group, an amino group, a hydroxyl group, a carboxyl group, a sulfonic acid group, a phosphoric acid group, an epoxy group, an allyl group, a methacryloyl group and an acryloyl group. Particularly useful compounds as the polymer having the functional group at the terminal or the side chain thereof include a hydrophilic polymer having a trialkoxysilyl group at the polymer terminal, a hydrophilic polymer having an amino group at the polymer terminal, a hydrophilic polymer having a carboxyl group at the polymer terminal, a hydrophilic polymer having an epoxy group at the polymer terminal, and a hydrophilic polymer having an isocyanate group at the polymer terminal.

The hydrophobic polymer for use in the present invention is not particularly limited so long as it exhibits hydrophilicity. Specific examples of the hydrophilic polymer include polyacrylic acid, polymethacrylic acid, polystyrene sulfonic acid, poly-2-acrylamide-2-methylpropane sulfonic acid and the salts thereof, polyacrylamide and polyvinyl acetamide. Additionally, a polymer synthesized from a hydrophilic monomer or a copolymer containing a hydrophilic monomer used for surface graft polymerization to be described below, may advantageously be used.

A graft polymer can be produced by polymerizing the compound having a polymerizable double bond through a method of surface graft polymerization described in the first aspect of the present invention. In the method of surface graft polymerization, active species are provided on the surface of the support by plasma irradiation, light irradiation or heating to allow the compound, having a polymerizable double bond and arranged to contact with the support, to bind to the support through polymerization.

Compound having a Polymerizable Double Bond Useful for Surface Graft Polymerization The compound having a polymerizable double bond useful for forming a hydrophilic graft polymer chain is required to have a polymerizable double bond and to exhibit hydrophilicity. Any compound, a hydrophilic polymer or a hydrophilic oligomer, may be used for this purpose so long as it contains a double bond in the molecule. Particularly useful is a hydrophilic monomer.

Examples of the hydrophilic monomer usable in the present invention include a monomer having positive charges, such as ammonium and phosphonium, or a monomer containing acidic groups having negative charges or capable of dissociating into negative charges, such as sulfonic acid groups, carboxyl groups, phoshoric acid groups and phosphonic acid groups. Additionally, hydrophilic monomers having a non-ionic group such as a hydroxyl group, an amide group, a sulfonamide group, an alkoxy group, and a cyano group may be used.

Specific examples of the hydrophilic monomer particularly usable in the present invention include (meth) acrylic acid or the alkali metal salts and the amine salts thereof; itaconic acid or the alkali metal salts and the amine salts thereof; allylamine or the halogenated hydroacid salts thereof; 3-vinylpropionic acid or the alkali metal salts and the amine salts thereof; vinylsulfonic acid or the alkali metal salts and the amine salts thereof; styrene sulfonic acid or the alkali metal salts and the amine salts thereof; 2-sulfoethylene(meth)acrylate and 3-sulfopropylene (meth)acrylate or the alkali metal salts and the amine salts thereof; 2-acrylamide-2-methylpropane sulfonic acid or the alkali metal salts and the amine salts thereof; acid phosphooxypolyoxyethylene glycol mono(meth)acrylate or the salts thereof; 2-dimethylaminoethyl(meth)acrylate or the halogenated hydroacid thereof; 3-trimethylammonium-propyl (meth)acrylate; 3-trimethylammonium-propyl(meth) acrylamide; N,N,N-trimethyl-N-(2-hydroxy-3-methacryloyloxypropyl)ammonium chloride. Also usable as the hydrophilic monomer are 2-hydroxyethyl(meth)acrylate, (meth)acrylamide, N-monometylol(meth)acrylamide, N-dimethylol(meth)acrylamide, N-vinyl pyrrolidone, N-vinyl acetamide and polyoxyethyleneglycol mono(meth)acrylate.

Method for Forming (b) Cross-linked Hydrophilic Layer to which the Hydrophilic Graft Chains are Introduced The cross-linked hydrophilic layer to which the hydrophilic graft chains are introduced can be formed by synthesizing a graft polymer using a method known in the art as the method for forming a graft polymer, followed by cross-linking the graft polymer. Synthesis of a graft polymer is described in "Graft Polymerization and Its Application" written by Humio Ide, edited by Publishing Association of Polymer and published in 1977 by Kyoritsu Publishing Co., and in "New Experimental Polymer Science vol. 2; Synthesis and Reaction of Polymer", edited by Polymer Science Association, Kyoritsu Publishing Co., 1995.

In principle, synthesis of the graft polymer may be divided into three categories: 1) a branch monomer is allowed to polymerize to a backbone polymer; 2) a branch polymer is allowed to bind to a backbone polymer; and 3) a branch polymer is allowed to copolymerize to a backbone polymer ("macromer method"). While any methods described above may be used for forming the hydrophilic surface according to the present invention, the third method (macromer method) is excellent in view of suitability for production and control of the film structure. Synthesis of the graft polymer using the macromer is described in "New Experimental Polymer Science, vol. 2; Synthesis and Reaction of Polymer", edited by Polymer Science Association, Kyoritsu Publishing Co., 1995 described above. The method is also described in detail in Isamu Yamashita et al., "Chemistry and Industry of Macromonomer", I.P.C., 1989.

Specifically, a hydrophilic macromer can be synthesized through a known method using the aforementioned hydrophilic monomer, such as acrylic acid, acrylamide, 2-acrylamide-2-methylpropane sulfonic acid and N-vinyl acetamide, so as to form an organic cross-linked hydrophilic layer.

Examples of the hydrophilic macromer for suitably use in the present invention include a macromer derived from a carboxylic group-containing monomer such as acrylic acid and methacrylic acid; a sulfonic acid based macromer derived from monomers of 2-acrylamide-2-methylpropane sulfonic acid and styrene sulfonic acid, and the salts thereof; an amide based macromer such as acrylamide and methacrylamide; an amide based macromer derived from N-vinylcarboxylic acid amide monomers such as N-vinylacetamide, N-vinylfolmamide; a macromer derived from a hydroxyl group-containing monomer such as hydroxyethyl methacrylate, hydroxyethyl acrylate and glycerol monomethacrylate; and a macromer derived from a alkoxy group or ethylene oxide group-containing monomer such as methoxyethyl acrylate, methoxypolyethyleneglycol acrylate and polyethyleneglycol acrylate. Monomers having a polyethyleneglycol chain or a polypropyleneglycol chain may also be used as the macromer for use in the present invention.

The useful molecular weight of the macromer is in the range of 400 to 100,000, preferably in the range of 1,000 to 50,000, and particularly preferably in the range of 1,500 to 20,000. When the molecular weight is 400 or less, the effect exerted by the macromer cannot be expected. When the molecular weight is larger than 100,000, polymerization with a copolymer constituting the main chain may be impaired.

One method for forming the cross-linked hydrophilic layer to which the hydrophilic graft chains are introduced after synthesis of the hydrophilic macromer comprises the steps of copolymerizing a hydrophilic macromer with another monomer having a functional group to synthesize a graft copolymer, and coating a cross-linking agent to cause a reaction between the synthesized graft copolymer and the reactive functional groups to effect cross-linking by heat. Another method comprises the steps of synthesizing a hydrophilic macromer and a graft polymer having a group capable of photo-crosslinking or a polymerizable group, coating them onto the support to effect cross-linking by light irradiation.

As stated above, the hydrophilic surface containing the hydrophilic graft polymer chain can be provided on the support. The thickness of the layer forming the hydrophilic surface may be selected depending on the use purposes. Usually, the thickness is preferably in the range of 0.001 $\mu$m to 10 $\mu$m, more preferably in the range of 0.01 $\mu$m to 5 $\mu$m, and most preferably in the range of 0.1 $\mu$m to 2 $\mu$m. When the layer is too thin, scratch resistance may be impaired, while when the layer is too thick, the effect for improving adhesiveness tends to be decreased.

In the present invention, it is not always necessary for the graft polymer to completely cover the entire surface of the support, even when a resin support is used. A sufficient effect for improving adhesiveness may be exhibited by introducing the graft polymer in a coverage proportion of 10% or more relative to the entire surface area of the support when the graft polymer is introduced to the surface of the resin support. The coverage proportion of the graft polymer relative to the entire surface area is preferably 30% or more, more preferably 60% or more.

Any materials may be used as the conductive material for forming the conductive film according to the second aspect of the present invention, without any limitation, so long as the material exhibits conductivity. Conductive materials known in the art, such as metals, semiconductor materials such as metal oxide semiconductors and copper iodide, conductive polymers, organic conductive materials, polymer electrolytes, carbon particles and carbon fibers may be used.

Among the above listed materials, suitable examples of the material for use in vapor phase methods such as vacuum deposition and sputtering include metals such as Au, Ag, Pt, Cu, Rh, Pd, Al and Cr, metal oxide semiconductors such as $In_2O_3$, $SnO_2$, ZnO, CdO, $TiO_2$, $CdIn_2O_4$, $Cd_2SnO_2$, $Zn_2SnO_4$ and $In_2O_3$—ZnO, the above materials doped with impurities compatible therewith, spinel structure compounds such as MgInO and CaGaO, conductive nitrides such as TiN, ZrN and HfN, and conductive boride compounds such as LaB.

In view of low resistivity, costs and stable supply, preferable examples of the material include metals such as Pd, Au, Ag, Pt, Cu, Rh, Al and Cr, metal oxide semiconductors such as $In_2O_3$, $SnO_2$, ZnO, CdO, $TiO_2$, $CdIn_2O_4$, $Cd_2SnO_2$, $Zn_2SnO_4$ and $In_2O_3$—ZnO, indium oxide containing $SnO_2$ as a dopant (ITO), tin oxide ($SnO_2$) containing Sb or F as a dopant.

Crystalline indium oxide is excellent in transparency and conductivity and may preferably be used in the present invention. Amorphous indium oxide, although having slightly higher resistivity than crystalline indium oxide, is excellent in flexibility when formed into a film and hardly generates cracks even when the resin support is bent. Therefore, an amorphous ITO layer may appropriately be used depending on the use purposes.

In order to form a conductive material layer by providing a conductive material on the hydrophilic surface on which the hydrophilic graft polymer chains are present, any known methods for disposing a conductive material may be used to form the layer. Among conventionally known methods, vapor film deposition method (vapor phase method) is preferable from the standpoint of forming a uniform layer. The vapor deposition methods include chemical vapor phase deposition (CVD) such as vapor deposition and physical vapor phase deposition (PVD) such as vacuum deposition and sputtering, and any such methods may preferably be used.

The thickness of the conductive material layer is not specifically limited. The thickness is preferably in the range of 1 nm to 2 $\mu$m, more preferably in the range of 10 nm to 1 $\mu$m. When the thickness is less than 1 nm, conductivity may be insufficient, while when the thickness exceeds 2 $\mu$m, transparency tends to be decreased.

Resin Support

Any resin support may be used for forming the conductive film according to the second aspect of the present invention so long as the resin support is dimensionally stable and fulfils the requirements of flexibility, strength and durability. If a transparent conductive film obtained according to the present invention is used for image display elements and solar cells, a transparent support having a smooth surface is used since high transparency is required of the film. The resin supports meeting the required flexibility, strength and durability as well as excellent transparency to transmit light of a visible wavelength region include, for example, plastic films such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal and polyallylate. When the conductive film is applied to a liquid crystal panel, polycarbonate and polyallylate are preferable considering optical and thermal characteristics.

The thickness of the resin support may appropriately be specified depending on the use purposes. Usually, the thickness is in the range of 10 to 200 $\mu$m.

A conductive film according to the second aspect of the present invention comprises a conductive material tightly and uniformly adsorbed to the surface of the support to form a layer on the surface of the support, by vacuum vapor deposition or the like, through an interaction between the conductive material and polar groups of the hydrophilic graft chains introduced to the resin support. This layer of the conductive material closely adhered to the hydrophilic surface can be formed without using a binder as an intermediate layer. Furthermore, since the layer of the conductive material is thin and excellent in light transmittance, this conductive film may preferably be used for transmissive image display elements and solar cells.

This conductive film can be produced by performing a relatively simple processing on the surface of any support material and is excellent in durability and conductivity. Thus, this conductive film is advantageously used for a variety of uses.

Third Aspect

The conductive film according to the third aspect of the present invention comprises a support including hydrophilic graft polymer chains, and comprises a layer of a conductive polymer provided on the support.

A hydrophilic surface having hydrophilic graft polymer chains can be provided on the support in a manner similar to the second aspect. Usually, the thickness of the layer forming the hydrophilic surface is preferably in the range of 0.001 $\mu$m to 10 $\mu$m, more preferably in the range of 0.01 $\mu$m to 5 μm, and most preferably in the range of 0.1 μm to 2 μm. When the layer is too thin, scratch resistance may be decreased, while when the layer is too thick, the effect for enhancing adhesiveness tends to be decreased.

In the present invention, even when the resin support is used, it is not always necessary for the graft polymer to perfectly cover the entire surface of the support. When the graft polymer is introduced to the surface of the resin support, a sufficient effect of enhancing adhesiveness may be obtained by introducing the graft polymer in a coverage proportion of 10% or more relative to the entire surface area of the support. The coverage proportion of the graft polymer is preferably 30% or more, more preferably 60% or more, relative to the entire surface area of the support.

The conductive polymer layer is formed by allowing the conductive polymer to be adsorbed to the hydrophilic functional groups of the hydrophilic polymer on the support. And this conductive polymer layer exhibits electrical conductivity.

Any conductive polymers may be used so long as the polymers have conductivity of $10^{-6}$ s·cm$^{-1}$ or more, preferably $10^{-1}$ s·cm$^{-1}$ or more. Specific examples of the conductive polymer include substituted and non-substituted conductive polyaniline, polyparaphenylene, polyparaphenylene vinylene, polythiophene, polyfuran, polypyrrole, polyselenophene, polyisothianaphthene, polyphenylene sulfide, polyacetylene, polypyridyl vinylene and polyazine. These polymers may be used singly or in a combination of two or more thereof depending of the use purposes. The conductive polymer may be admixed with another non-conductive polymer in a range enough to exhibit desired conductivity. Alternatively, a copolymer of a conductive monomer and a non-conductive monomer may be used.

In order to form a conductive polymer layer by using such a conductive polymer, any method may be employed without any limitation, however, the method using the following conductive monomers is preferably employed from the standpoint of forming a uniform thin layer.

First, a support having a hydrophilic surface having hydrophilic graft polymer chains is immersed in a solution containing a polymerization catalyst such as potassium persulfate or iron (III) sulfate or a compound capable of initiating polymerization. While stirring the solution, a monomer capable of forming a conductive polymer such as 3,4-ethylenedioxy thiophene is gradually added dropwise. As a result, the monomer capable of forming the conductive polymer is tightly adsorbed to the hydrophilic functional groups of the graft polymer chain via their interaction, while simultaneously proceeding a polymerization reaction of the monomers, to thereby form, on the hydrophilic surface having the hydrophilic graft polymer chains, a very thin film of the conductive polymer to act as the conductive polymer layer.

Since the thus formed conductive polymer layer is a product of polymerization reaction effected on the hydrophilic surface, a very thin and uniform film homogeneous in quality and thickness can advantageously be formed by controlling the conditions such as a feeding rate of the monomer.

The thin layer of the conductive polymer may directly be formed on the surface of a resin support such as PET by causing polymerization reaction on the surface of the support, however, such a layer which is incapable of interacting with the resin support is easily peeled off, thus failing in forming a thin film having a practically acceptable level of strength.

Since the conductive monomer itself is tightly adsorbed to the hydrophilic groups of the graft polymer chain by creating an electrostatic or polar interaction, the polymer layer is strong enough against abrasion and scratch even if the layer is thin.

By selecting the materials such that hydrophilic functional groups adsorb the conductive polymer via a relation between a cation and an anion, the hydrophilic functional groups act as a counter anion to adsorb the conductive polymer. Since the hydrophilic functional group contributes as a certain kind of dopant, the conductive film acquires an effect for further improving conductivity. In more detail, if styrene sulfonic acid is selected for use as the hydrophilic group and thiophene is selected for use as the material for the conductive layer, polythiophene containing the sulfonic acid group (sulfo-group) is present in the interface between the hydrophilic surface and conductive polymer layer, whereby polythiophene acts as a dopant of the conductive polymer.

The thickness of the conductive polymer layer formed on the surface of the support is not particularly limited. The thickness of the conductive polymer layer is preferably in the range of 1 nm to 2 μm, more preferably in the range of 10 nm to 1 μm. If the thickness of the conductive polymer layer falls within this range, sufficient conductivity and transparency can be achieved. The thickness less than 1 nm is not preferable since conductivity may become insufficient.

Resin Support

In the third aspect of the present invention, the same resin support as employed in the second aspect may be used for forming the conductive film. Since high transparency is required of the conductive film to be used for image display elements and solar cells, a transparent material having surface smoothness is preferably used. Examples of the supports having dimensional stability, meeting the requirements of flexibility, strength and durability as well as excellent transmittance of light of a visible wavelength region include films made of a resin such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal and polyallylate. If the conductive film is used for a liquid crystal panel, polycarbonate and polyallylate are particularly preferable considering optical and thermal characteristics.

The thickness of the resin support may appropriately be selected, usually ranging from 10 to 200 μm.

A conductive film according to the third aspect of the present invention comprises a conductive polymer tightly and uniformly adsorbed to the surface of the support to form a layer on the surface of the support through an interaction between the conductive polymer and polar groups of the hydrophilic graft chains introduced to the resin support. This layer of the conductive polymer tightly adhered to the hydrophilic surface is formed without using a binder as an intermediate layer. Furthermore, since the layer of the conductive polymer is thin and excellent in light transmittance, this conductive film may preferably be used for transmissive image display elements and solar cells.

The layer of conductive polymer can be produced by performing a relatively simple processing on the surface of any support material and is excellent in durability and conductivity. Thus, this conductive film is advantageously used for a variety of uses.

The conductive film may preferably be used for a flexible electro-luminescence device (OLED), a touch screen and an organic TFT. Further, the conductive film may preferably be used for image display elements such as a flexible liquid crystal display and solar cells by forming the conductive film as a transparent conductive film by selecting materials.

EXAMPLES

The present invention will now be illustrated by the following Examples, but it is to be understood that the invention is not limited to the Examples.

Examples 1 and 2

Preparation of a Support having on the Surface Thereof Ionic Groups

A biaxially oriented polyethylene terephthalate film (A4100 manufactured by Toyobo Co., Ltd.) having a thickness of 188 μm was subjected to an oxygen glow treatment under the following conditions using a planographic magnetron sputtering apparatus (CFS-10-EP70 manufactured by Shibaura Eletec Corporation).

Oxygen Glow Treatment Conditions

Initial vacuum: $1.2 \times 10^{-3}$ Pa

Oxygen pressure: 0.9 Pa

RF glow: 1.5 KW

Treating time: 60 sec

Introduction of Ionic Groups

The film, which had been subjected to the glow treatment, was immersed in a nitrogen bubbled solution of sodium styrene sulfonate (10 wt %) for 7 hours at 70° C. The immersed film was washed with water for 8 hours to thereby obtain a polymer support (support A) on which sodium styrene sulfonate was grafted.

The same procedures were conducted as above, except that sodium styrene sulfonate was replaced with acrylic acid, to thereby obtain a polymer support (support B) on which acrylic acid was grafted.

Fine Particles of Metal Oxide Capable of Ionically Bonding to Ionic Groups

In this example, Ag particles having positive charges prepared in a manner described below were used as the fine particles of metal oxide.

To 50 ml of an ethanol solution (5 mM) containing silver perchlorate was added 3 g of bis(1,1-trimethylammonium decanoylaminoethyl)disulfide, followed by slowly dropwise addition of 30 ml of a solution of sodium boron hydride (0.4M) with vigorous stirring so as to reduce the ions, thereby obtaining a dispersion of silver particles coated with quaternary ammonium. The mean particle diameter of the resultant silver particles was measured by an electron microscope and found to be 5 nm.

Coating of the Charged Particles onto the Support

The supports A and B having respective surface grafts were immersed in a dispersion of the positively charged Ag particles obtained as above. Then the surfaces of the supports were thoroughly washed with running water to remove an excess dispersion of the fine particles, to thereby produce conductive films A and B.

The surfaces of the conductive films A and B were observed with a transmission electron microscope (JEM-20CX manufactured by JEOL) at a magnification of 100,000, to confirm that Ag fine particles produced a finely textured layer having a uniform concavo-convex shape on both surfaces.

Evaluation of Performance of Conductive Film

Electrical Conductivity

The conductive films were evaluated for electrical conductivity and the deviations by measuring the sheet resistivity. The surface resistivity was measured by a four-probe method using LORESTA-FP (manufactured by Mitsubishi Chemical Co., Ltd.), and corrected with respect to the shape.

Then, additional surface resistivities were measured by the same method as above at arbitrary five sites on the conductive film surface so as to evaluate deviations from a mean value. The film having a deviation within ±3% from the mean value of surface resistivity was assessed as a permissible deviation (represented by ○), while the film having a deviation exceeding ±3% from the mean value of surface resistivity was assessed as a non-permissible deviation (represented by x).

Five additional samples, respectively, (i.e., conductive films A-1 to A-5 and conductive films B-1 to B-5) were prepared in the same manner as conducted for forming the conductive films A and B. These additional samples were measured for the surface resistivity in a manner similar to the above, and the deviations from a mean value were evaluated. The film having a deviation within ±3% from the mean value was assessed as a permissible reproducibility (represented by ○), while the film having a deviation exceeding ±3% from the mean value was assessed as a non-permissible reproducibility (represented by x).

The conductive film A had a surface resistivity of 350 Ω/□, and the surface deviation and reproducibility were both within a permissible range. The conductive film B had a surface resistivity of 300 Ω/□, and the deviation of surface resistivity and reproducibility were both within a permissible range. These results reveal that both conductive films have excellent functions as a conductive film exhibiting sufficient properties in uniformity of the conductive film and in production stability (reproducibility).

Light Transmittance

Transmittance of light having an wavelength of 550 nm was measured with a spectrophotometer UV2400-PC (Manufactured by Shimadzu Corporation) using air as a reference. The conductive films A and B had transmittances of 80% or more and 90% or more, respectively, showing that both conductive films have good transmittance of visible light and are excellent enough for use as a transparent conductive film.

Abrasion Resistance

The conductive films A and B obtained above were subjected to manually rubbing 30 times, forward and backward, with a moistened cloth (BEMCOT manufactured by Asahi Chemical Industry Co.). After rubbing, the surfaces of these conductive films were observed again with a transmission electron microscope (JEM-200CX manufactured by JEOL) at a magnification of 100,000. The same finely textured layer was observed even after rubbing treatment as observed before rubbing, confirming that the regularly arranged concavo-convex shape was not damaged by rubbing.

From the results obtained in Examples 1 and 2, it is revealed that the conductive films according to the present invention are uniform and have excellent conductivity, and the transparent conductive layer formed on the surface had good durability, usable for practical applications.

Examples 3 and 4

The same procedures were carried out as conducted in Examples 1 and 2 to prepare supports C and D which had ionic groups on the surface thereof.

Preparation of Conductive Film

The support C was subjected to sputtering to form on the surface thereof a thin layer of indium-tin oxide to prepare conductive film C.

Sputtering was conducted using a composition of indium/tin of 90/10 (weight ratio) as a sputtering target and charging density of 90%. The support C was placed in a sputtering apparatus, and after evacuation to 1.3 mPa, a mixed gas of argon/oxygen in a volume ratio of 98.5/1.5 was introduced thereto. After adjusting the atmospheric pressure to 0.27 Pa and the support temperature to 50° C., an electric power of 1 W/cm$^2$ was applied to perform DC sputtering. The thus obtained conductive material layer had a thickness of 100 nm.

Using the support D, the same procedures were conducted as above to produce conductive film D.

The surfaces of the conductive films C and D were observed using a transmission electron microscope (JEM-200CX manufactured by JEOL) at a magnification of 100,000, confirming that both films have a finely textured layer formed on the both surfaces of the support.

Evaluation of Performance of Conductive Film

Electrical Conductivity

The conductive films were evaluated for electrical conductivity and the deviations by measuring the sheet resistivity. The surface resistivity was measured by a four-probe method using LORESTA-FP (manufactured by Mitsubishi Chemical Co., Ltd.), and corrected with respect to the shape.

Then, additional surface resistivities were measured by the same method as above at arbitrary five sites on the conductive film surface so as to evaluate deviations from a mean value. The film having a deviation within ±3% from the mean value of surface resistivity was assessed as a permissible deviation (represented by ○), while the film having a deviation exceeding ±3% from the mean value of surface resistivity was assessed as a non-permissible deviation (represented by x).

Five additional samples, respectively, (i.e., conductive films C-1 to C-5 and conductive films D-1 to D-5) were prepared in the same manner as conducted for forming the conductive films C and D. These additional samples were measured for the surface resistivity in a manner similar to the above, and the deviations from a mean value were evaluated. The film having a deviation within ±3% from the mean value was assessed as a permissible reproducibility (represented by ○), while the film having a deviation exceeding ±3% from the mean value was assessed as a non-permissible reproducibility (represented by x).

The conductive film C had a surface resistivity of 40 Ω/□, and the deviation of surface resistivity and reproducibility were both within a permissible range. The conductive film D had a surface resistivity of 35 Ω/□, and the deviation of surface resistivity and reproducibility were both within a permissible range. These results manifest that both conductive films have excellent functions as a conductive film exhibiting sufficient properties, such as uniformity of the conductive film and production stability (reproducibility).

Light Transmittance

Transmittance of light having an wavelength of 550 nm was measured with a spectrophotometer UV2400-PC (Manufactured by Shimadzu Corporation) using air as a reference. The conductive films C and D had transmittances of over 80% and over 90%, respectively, showing that both conductive films have good transmittance of visible light and are excellent enough for use as a transparent conductive film.

Adhesiveness of the Layer

The conductive films C and D were evaluated for adhesiveness of the formed layer to the surface of the support by a checkerboard square tape method in accordance with JIS 5400. A peeling test of the surface of each conductive film cut into checkerboard squares showed that any one of the squares were not peeled off, confirming that the conductive films have good adhesiveness.

From the results obtained in Examples 3 and 4, it is confirmed that the conductive films according to the present invention are uniform and have excellent electrical conductivity, and the conductive layer formed on the surface had good durability, to be useful for practical applications.

Example 5

Preparation of Support E having on the Surface thereof Hydrophilic Polymer (1) Formation of a Layer on the Support A coating solution used for photo-polymerization having the following composition was applied using a rod bar #17 onto a PET film (M4100 manufactured by Toyobo Co.) having a thickness of 0.188 mm, and then dried at 80° C. for 2 minutes to form a layer. The formed layer was pre-cured by irradiating light for 10 minutes using a 400W high pressure mercury-vapor lamp (UVL-400P manufactured by Riko Kagaku Sangyo). The coating solution used for photo-polymerization had the following composition:

| | |
|---|---|
| Allylmethacrylate/methacrylic acid copolymer (molar ratio 80/20, molecular weight 100,000) | 4 g |
| Ethylene oxide modified bisphenol A diacrylate (M210 manufactured by Toa Gosei Co.) | 4 g |
| 1-Hydroxycyclohexylphenyl ketone | 1.6 g |
| 1-Methoxy-2-propanol | 16 g |

(2) Surface Graft Polymerization of Hydrophilic Monomer onto a Layer Formed on a Support The resultant film was immersed in an aqueous solution containing sodium styrene sulfonate (10 wt %) and sodium hypochlorite (NaIO$_4$, 0.01 wt %), and irradiated with light using a 400W high pressure mercury-vapor lamp for 30 minutes in an argon atmosphere. The film obtained after light irradiation was thoroughly washed with ion exchanged water to give support E on which sodium styrene sulfonate was grafted (surface grafted).

Formation of a Conductive Polymer Layer on the Surface Layer of the Support

The support E having the graft chains of polystyrene sulfonate was immersed in a 2000 ml of solution in which 13.0 g of potassium persulfate and 50 mg of iron(III) sulfate were dissolved. Then, 5.5 g of 3,4-ethylenedioxythiophene was slowly added thereto dropwise. Stirring was provided for 10 hours at room temperature. The support E was taken out from the solution followed by washing with water, to thus afford conductive film E of Example 5 on which a polythiophene layer was formed as a conductive layer on the surface layer of the support E.

Example 6

Support F on which acrylic acid was grafted (surface grafted) was obtained in the same manner as conducted in Example 5, except that sodium styrene sulfonate used for forming support E in Example 5 was changed to acrylic acid.

The support F having on the surface thereof the acrylic acid graft chains was immersed in a solution in which 1.23 g of sodium anthraquinone-2-sulfonate monohydrate, 7.20 g of sodium 5-sulfosalicylate monohydrate and 4.38 g of iron trichloride hexahydrate were dissolved in 125 ml of water, followed by addition of 0.75 ml of pyrrole and 125 ml of water with stirring. After 1 hour, the support F was taken out from the solution, washed successively with water and acetone, to thereby obtain conductive film F of Example 6 on which a polypyrrole layer was formed as a conductive polymer layer on the surface layer of the support F.

Comparative Example 1

A dispersion of poly(3,4-ethylenedioxythiophene) containing polystyrene sulfonic acid as a counter-anion was prepared according to the method described in JP-A No. 9-12968. The thus prepared solution was coated using a rod bar No.18 onto a PET film (M4100 manufactured by Toyobo Co.) having a thickness of 0.188 mm, and then dried for 5 minutes at 100° C. to obtain a conductive film.

Evaluation of Performance of the Conductive Film

Electrical Conductivity

The conductive films were evaluated for electrical conductivity and the deviations by measuring the sheet resistivity. The surface resistivity was measured by a four-probe method using LORESTA-FP (manufactured by Mitsubishi Chemical Co., Ltd.), and corrected with respect to the shape. The lower the surface resistivity ($\Omega/\square$) was, the higher electrical conductivity was assessed. The results are shown in Table 1 below.

Pencil Hardness Test

The strength of the surface of the produced conductive film was measured by the method according to JIS G0202. The higher the pencil hardness, i.e., the larger value of hardness (H) of a pencil used in the test in the order from H1 to H4, the film was evaluated to have higher strength. The results are shown in Table 1 below.

TABLE 1

| | Surface Resistivity ($\Omega/\square$) | Pencil Hardness |
|---|---|---|
| Example 5 | 1,500 | 4 H or more |
| Example 6 | 900 | 4 H or more |
| Comparative Example 1 | 2,000 | 1 H |

As apparent from the results shown in Table 1, the conductive films according to the present invention exhibit high electrical conductivity and excellent film strength, and further, the conductive polymer layers formed thereon are excellent in scratch resistance. On the other hand, the conventional conductive film obtained in Comparative Example 1, which was produced using a thiophene-based conductive polymer having a structure similar to the polymer employed in Example 5, is inferior in scratch resistance to the conductive films obtained in the examples, although it exhibits moderate electrical conductivity.

Light Transmittance

Transmittance of light having a wavelength of 550 nm was measured with a spectrophotometer UV2400-PC (Manufactured by Shimadzu Corporation) using air as a reference. The conductive films A and B had transmittances of both above 80%, showing that both conductive films have good transmittance of visible light and are excellent enough for use as a transparent conductive film.

Adhesiveness of the Layer

Produced conductive films were evaluated for adhesiveness of the formed layer to the surface of the support by a checkerboard square tape method in accordance with JIS 5400. A peeling test of the surface of each conductive film cut into checkerboard squares showed that any one of the squares, from the layers of the conductive films obtained in Examples 5 and 6, were not peeled off, confirming that the conductive films have good adhesiveness. On the other hand, when the conductive film obtained in Comparative Example 1 was tested, approximately 30% of the squares were peeled off, showing low adhesiveness.

Comparative Example 2

The same procedures were conducted as carried out in Example 5 by directly forming a polythiophene layer as a conductive polymer layer on the surface of a PET film (M4100 manufactured by Toyobo Co.) having a thickness of 0.188 mm, except that the hydrophilic graft chains used in Example 5 were not introduced to the surface of the PET film.

The surface resistivity of this conductive film was measured in the same manner as conducted in example 5, showing that the surface resistivity was $10^7$ $\Omega/\square$. The pencil hardness measured was below H1 and the film was readily peeled off, showing that the film does not have a sufficient film strength for practical application.

As shown by the results obtained in Examples 5 and 6, the conductive films according to the present invention are excellent in both electrical conductivity and durability, and can preferably be used for image display devices such as a flexible electro-luminescence device (OLED) and solar cells. Further, since the conductive polymer layer formed on the support is excellent in adhesiveness and scratch resistance, the conductive film can preferably be used for a flexible liquid crystal display, an organic TFT which requires flexibility, and a touch screen which undergoes repeated stress.

As described above, the conductive film according to the present invention exhibit excellent electrical conductivity and durability. Further, if a transparent support is used, the resultant conductive film can suitably be used for image display elements and solar cells. In addition, the conductive film according to the present invention can be manufactured in low cost, with achieving high film strength, excellent adhesiveness to the support even when a resin support is used, and high scratch resistance.

What is claimed is:

1. A conductive film comprising a support having introduced to at least one surface thereof ionic groups to which conductive fine particles, having electrical charges so as to be bondable to the ionic groups, are electrostatically bonded.

2. The conductive film according to claim 1, wherein the support comprises a surface graft polymer introduced thereto by graft polymerization.

3. The conductive film according to claim 1, wherein the conductive fine particles are selected from the group consisting of fine particles of a metal, fine particles of an oxide semiconductor, fine particles containing impurities as a dopant, fine particles of a spinel structure compound, fine particles of a conductive nitride, fine particles of a conductive boride compound and fine particles of a conductive polymer.

4. The conductive film according to claim 3, wherein the conductive fine particles have a particle size in the range of 0.1 nm to 1000 nm.

5. A conductive film comprising a support, which includes hydrophilic graft polymer chains, and a layer of a conductive material provided on the support.

6. The conductive film according to claim 5, wherein the layer of the conductive material has a thickness in the range of 1 nm to 2 $\mu$m.

7. The conductive film according to claim 5, wherein the hydrophilic graft copolymer chains have a molecular weight of 500 to 5,000,000.

8. The conductive film according to claim 5, wherein the hydrophilic graft copolymer chains form a hydrophilic surface having a thickness in the range of 0.001 $\mu$m to 10 $\mu$m.

9. The conductive film according to claim 6, wherein the conductive material is a metal selected from the group consisting of Pd, Au, Ag, Pt, Cu, Rh, Al and Cr.

10. The conductive film according to claim 6, wherein the conductive material is a metal oxide semiconductor selected from the group consisting of $In_2O_3$, $SnO_2$, ZnO, CdO, $TiO_2$, $CdIn_2O_4$, $Cd_2SnO_2$, $Zn_2SnO_4$ and $In_2O_3$—ZnO.

11. The conductive film according to claim 6, wherein the conductive material is at least one of indium oxide (ITO) containing $SnO_2$ as a dopant and tin oxide ($SnO_2$) containing Sb or F as a dopant.

12. The conductive film according to claim 5, wherein the layer of the conductive material is formed by a vapor phase method selected from the group consisting of chemical vapor deposition, vacuum deposition and sputtering.

13. A conductive film comprising a support, which includes hydrophilic polymer chains, and a layer of a conductive polymer provided on the support.

14. The conductive film according to claim 13, wherein the hydrophilic polymer contains hydrophilic graft polymer chains.

15. The conductive film according to claim 14, wherein the hydrophilic polymer forms a hydrophilic surface having a thickness in the range of 0.001 µm to 10 µm.

16. The conductive film according to claim 14, wherein the hydrophilic graft polymer chains have a molecular weight in the range of 500 to 5,000,000.

17. The conductive film according to claim 13, wherein the conductive polymer has a conductivity of $10^{-6}$ s·cm$^{-1}$ or more.

18. The conductive film according to claim 13, wherein the conductive polymer has a conductivity of $10^{-1}$ s·cm$^{-1}$ or more.

19. The conductive film according to claim 17, wherein the conductive polymer is selected from the group consisting of substituted or non-substituted conductive polyaniline, polyparaphenylene, polyparaphenylene vinylene, polythiophene, polyfuran, polypyrrole, polyselenophene, polyisothianaphthene, polyphenylene sulfide, polyacetylene, polypyridyl vinylene and polyazine.

20. The conductive film according to claim 13, wherein the layer of the conductive polymer has a thickness in the range of 1 nm to 2 µm.

* * * * *